(12) United States Patent
Otsubo et al.

(10) Patent No.: US 12,207,390 B2
(45) Date of Patent: Jan. 21, 2025

(54) MODULE

(71) Applicant: Murata Manufacturing Co., Ltd., Nagaokakyo (JP)

(72) Inventors: Yoshihito Otsubo, Nagaokakyo (JP); Takahiro Kitazume, Nagaokakyo (JP); Takanori Uejima, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 419 days.

(21) Appl. No.: 17/649,401

(22) Filed: Jan. 31, 2022

(65) Prior Publication Data

US 2022/0159825 A1    May 19, 2022

Related U.S. Application Data

(63) Continuation of application No. PCT/JP2020/028654, filed on Jul. 27, 2020.

(30) Foreign Application Priority Data

Aug. 1, 2019  (JP) ................................ 2019-142317
Jul. 16, 2020  (JP) ................................ 2020-122281

(51) Int. Cl.
*H05K 1/11*    (2006.01)
*H05K 1/02*    (2006.01)
*H05K 9/00*    (2006.01)

(52) U.S. Cl.
CPC ........... *H05K 1/0218* (2013.01); *H05K 1/115* (2013.01); *H05K 9/0024* (2013.01); *H05K 2201/10371* (2013.01)

(58) Field of Classification Search
CPC ...... H05K 1/182–1/188; H05K 1/0218; H05K 1/115
See application file for complete search history.

(56) References Cited

U.S. PATENT DOCUMENTS

2004/0211590 A1 *  10/2004  Tagi ..................... H05K 1/186
                                                           361/780
2014/0293550 A1    10/2014  Mugiya et al.
(Continued)

FOREIGN PATENT DOCUMENTS

JP    2014-203881 A    10/2014
WO    2016/181954 A1    11/2016
WO    2018/164158 A1    9/2018

OTHER PUBLICATIONS

International Search Report for PCT/JP2020/028654 dated Oct. 27, 2020.
Written Opinion for PCT/JP2020/028654 dated Oct. 27, 2020.

*Primary Examiner* — Jeremy C Norris
(74) *Attorney, Agent, or Firm* — Pearne & Gordon LLP

(57) ABSTRACT

A module includes: a board having a first main surface; a first component mounted on the first main surface; a first conductor column group including a plurality of conductor columns arranged on the first main surface along at least a part of an outer periphery of the first component; a first ground conductor disposed inside the board; a first conductor via group including a plurality of via conductors that connect the first ground conductor and an end of each of the conductor columns, the end of each of the conductor columns being located close to the first main surface; and a shield film disposed to cover over the first component. When viewed in a cross section taken along a plane perpendicular to the first main surface, the first component is at least partially surrounded by the first conductor column group, the first conductor via group, and the first ground conductor.

20 Claims, 10 Drawing Sheets

(56) References Cited

U.S. PATENT DOCUMENTS

2018/0092257 A1     3/2018   Otsubo et al.
2018/0374798 A1   12/2018   Lee et al.
2019/0393166 A1   12/2019   Otsubo

* cited by examiner

MODULE

CROSS REFERENCE TO RELATED APPLICATION

This is a continuation of International Application No. PCT/JP2020/028654 filed on Jul. 27, 2020 which claims priority from Japanese Patent Application No. 2019-142317 filed on Aug. 1, 2019 and Japanese Patent Application No. 2020-122281 filed on Jul. 16, 2020. The contents of these applications are incorporated herein by reference in their entireties.

BACKGROUND OF THE DISCLOSURE

Field of the Disclosure

The present disclosure relates to a module.

Description of the Related Art

Japanese Patent Laid-Open No. 2014-203881 (PTL 1) discloses a circuit module in which a groove portion is provided in a sealing resin by laser processing and filled with an electrically conductive resin or an electrically conductive paint to thereby form an electrically conductive shield. In this case, a thick portion is provided in a wiring portion provided on a wiring board.

PTL 1: Japanese Patent Laid-Open No. 2014-203881

BRIEF SUMMARY OF THE DISCLOSURE

First, in the configuration disclosed in PTL 1, the groove portion is provided in the sealing resin by laser processing. Thus, embedded components may be damaged during laser processing. Further, the wiring board may also be damaged. In the case of laser processing, scanning with laser light is temporarily stopped at a corner portion where the groove portion is bent. Accordingly, damage to the wiring board tends to increase at this corner portion.

Further, in PTL 1, the thick portion of wires is formed on the wiring board in order to protect the wiring board. This thick portion is formed of a metal component or the like, which therefore sacrifices the area on which components can be mounted on the wiring board. Consequently, size reduction of the module is hindered.

Thus, an object of the present disclosure is to provide a module that can be reduced in size since a shield can be disposed in the vicinity of mounted components without damaging a wiring board.

In order to achieve the above-described object, a module according to the present disclosure includes: a board having a first main surface; a first component mounted on the first main surface; a first conductor column group including a plurality of conductor columns arranged on the first main surface along at least a part of an outer periphery of the first component; a first ground conductor disposed inside the board; a first conductor via group including a plurality of via conductors that connect the first ground conductor and an end of each of the conductor columns belonging to the first conductor column group, the end of each of the conductor columns being located close to the first main surface; and a shield film disposed to cover over the first component. When viewed in a cross section taken along a plane perpendicular to the first main surface, the first component is at least partially surrounded by the first conductor column group, the first conductor via group, and the first ground conductor.

The present disclosure can provide a module that can be reduced in size since the shield can be disposed in the vicinity of the mounted components without damaging the wiring board.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept "upper" or "lower" does not necessarily indicate an absolute upper or lower position, but may indicate a relatively upper or lower position in the posture shown in each figure.

First Embodiment

A module in the first embodiment according to the present disclosure will be hereinafter described with reference to FIGS. 1 to 4. The module disclosed herein may be a module having components embedded therein or a module having components mounted thereon.

Figure 1:
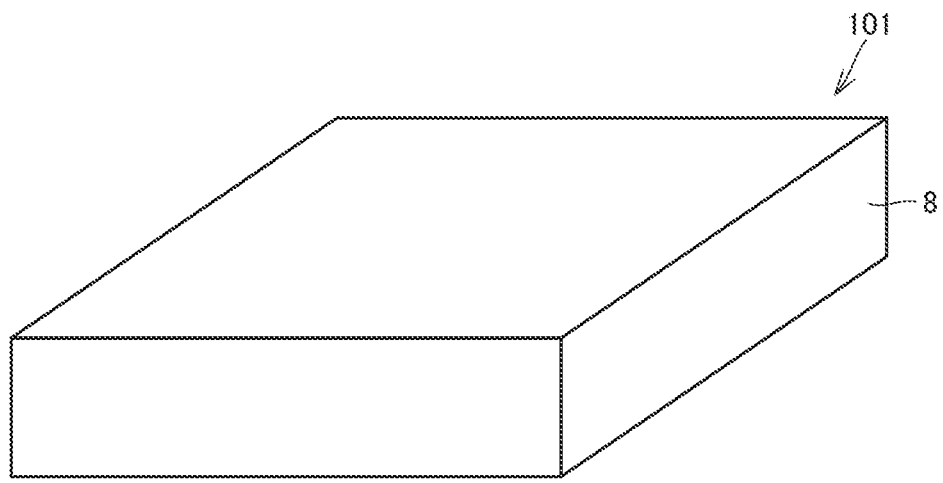
FIG. 1 is a first perspective view of a module in a first embodiment according to the present disclosure.
Figure 2:
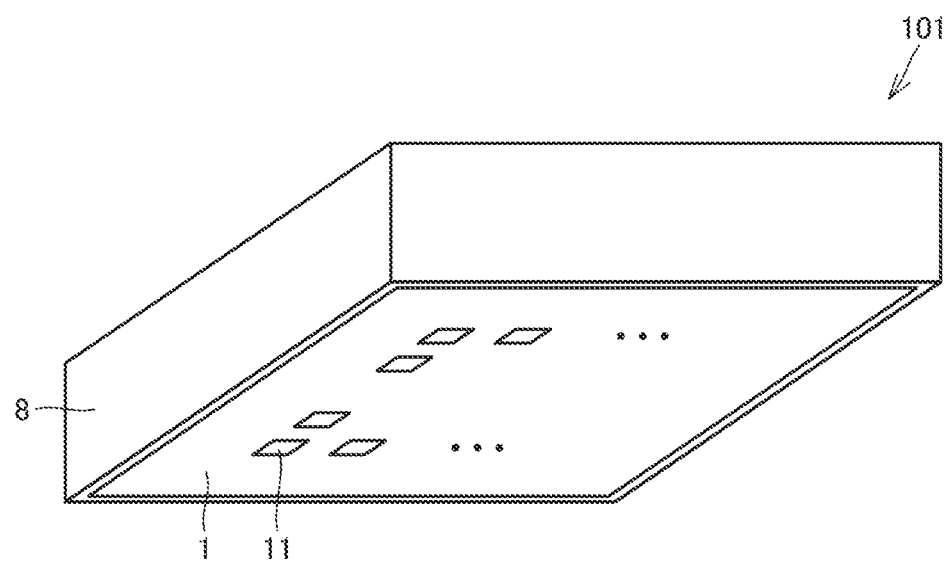
FIG. 2 is a second perspective view of the module in the first embodiment according to the present disclosure.
Figure 3:
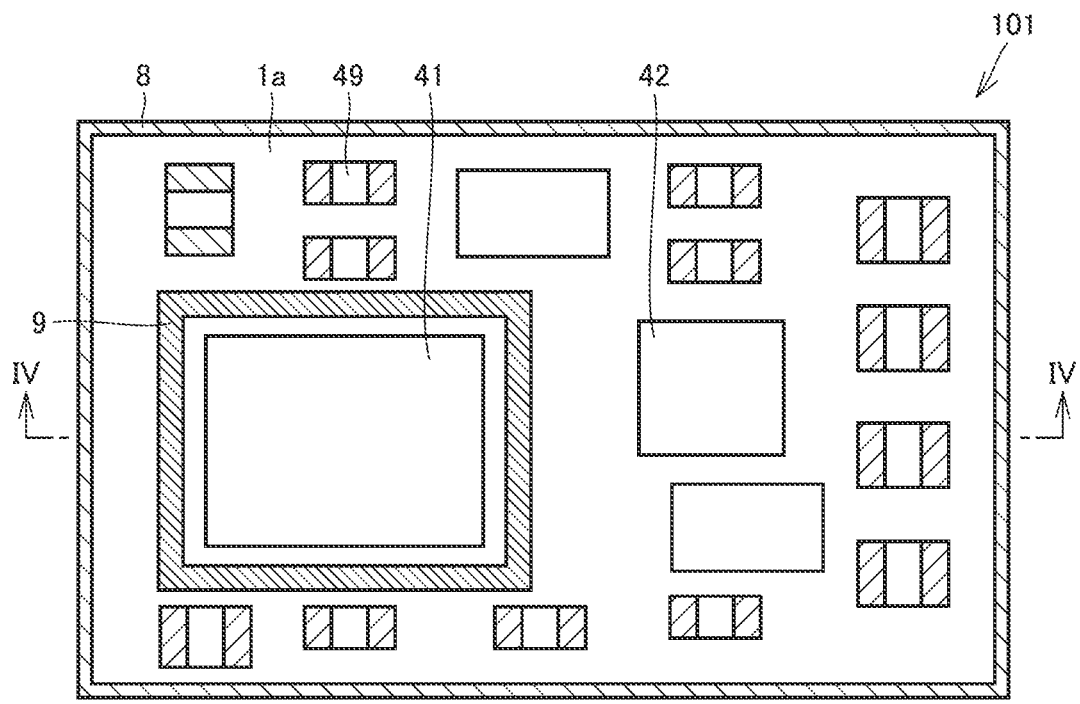
FIG. 3 is a perspective plan view of the module in the first embodiment according to the present disclosure.
Figure 4:
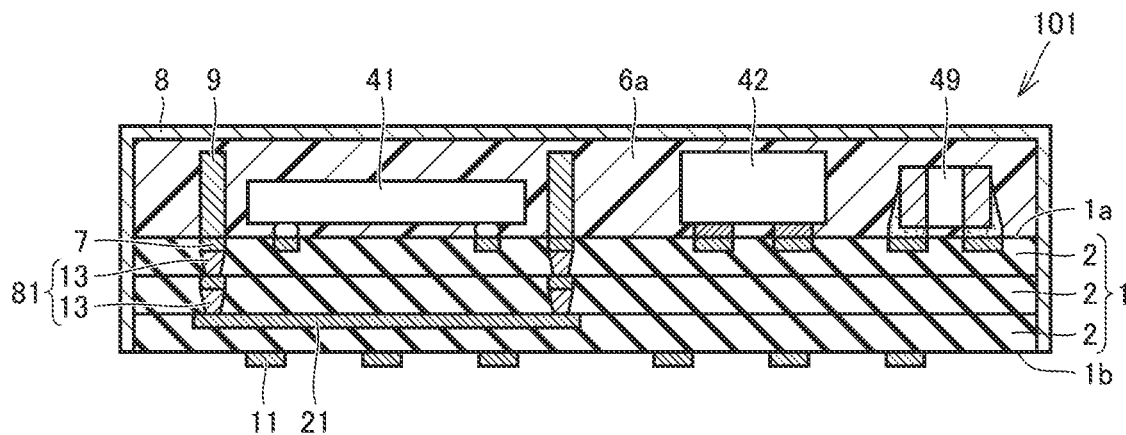
FIG. 4 is a cross-sectional view taken along a line IV-IV in FIG. 3.

FIG. 1 shows an external appearance of a module 101 in the present embodiment. The upper surface and the side surface of module 101 are covered with a shield film 8. FIG. 2 shows module 101 in FIG. 1 viewed obliquely from below. The lower surface of module 101 is not covered with shield film 8, so that a board 1 is exposed. One or more external electrodes 11 are provided on the lower surface of board 1. The number, the size, and the arrangement of external electrodes 11 in FIG. 2 are shown merely by way of example. FIG. 3 shows a perspective plan view of module 101. FIG. 3 is a top plan view of module 101 from which the upper surface of shield film 8 has been removed and a first sealing resin 6a has also been removed. First component 41 is mounted on a first main surface 1a of board 1. First component 41 may be an integrated circuit (IC), for example. More specifically, first component 41 may be a low noise amplifier (LNA), for example. A plurality of pad electrodes 7 are disposed on first main surface 1a. FIG. 4 is a cross-sectional view taken along a line IV-IV in FIG. 3. Board 1 may have wiring mounted thereon or embedded therein. Board 1 may be a resin board or a ceramic board. Board 1 may be a multilayer board.

Module 101 in the present embodiment includes: a board 1 having a first main surface 1a; a first component 41 mounted on first main surface 1a; a conductor wall-like member 9 disposed on first main surface 1a along at least a part of an outer periphery of first component 41; a first ground conductor 21 disposed inside board 1; a first conductor via group 81 including a plurality of via conductors that connect first ground conductor 21 and an end of conductor wall-like member 9, the end of conductor wall-like member 9 being located close to first main surface 1a; and a shield film 8 disposed to cover over first component 41. When viewed in a cross section taken along a plane perpendicular to first main surface 1a, first component 41 is at least partially surrounded by conductor wall-like member 9, first conductor via group 81, and first ground conductor 21. In other words, first component 41 is shielded by conductor wall-like member 9, first conductor via group 81, and first ground conductor 21 that are electrically connected to be contiguous to each other. In the example shown in this case, conductor wall-like member 9 is not in contact with shield film 8.

As a conductor wall-like member, for example, a copper block or a metal plate is applicable. When board 1 is a ceramic board, a protruding electrode may also be used as a conductor wall-like member.

In the example shown in this case, as shown in FIG. 3, conductor wall-like member 9 is rectangular in a plan view, which is however shown merely by way of example. Conductor wall-like member 9 is not necessarily annular. When first component 41 is rectangular in a plan view, conductor wall-like member 9 does not necessarily have to extend along all four sides of the outer periphery of first component 41. Conductor wall-like member 9 may extend along only some of four sides of the outer periphery of first component 41. For example, conductor wall-like member 9 may extend along only one side of the outer periphery of first component 41.

As shown in FIG. 4, board 1 may be formed by stacking a plurality of insulating layers 2. Board 1 has first main surface 1a and a second main surface 1b opposite to first main surface 1a. In addition to first component 41, a component 42 and a chip component 49 are also mounted on first main surface 1a of board 1. The shape, the number, the arrangement, and the like of each of component 42, chip component 49 and the like shown in this case are merely by way of example. In the example shown in this case, first component 41 and conductor wall-like member 9 are sealed by first sealing resin 6a.

In the present embodiment, the module can be reduced in size since the shield can be disposed in the vicinity of the mounted components without damaging the wiring board. In particular, as shown in FIG. 4, conductor wall-like member 9, first conductor via group 81, and first ground conductor 21 are electrically connected to be contiguous to each other so as to at least partially surround first component 41. Thereby, the shield for first component 41 as a mounted component can be reinforced as a compartment shield. Further, since conductor wall-like member 9 and shield film 8 are not connected to each other, various noises transmitted through shield film 8 are separated, and thus, noises requiring countermeasures to be taken can be shielded in a focused manner. When the conductor wall-like member is not connected to the shield film, the height of the conductor wall-like member may preferably be higher than the circuit surface of the mounted component surrounded by the conductor wall-like member. Further, the height of the conductor wall-like member may preferably be higher than the height of the mounted component. In the example shown in this case, since conductor wall-like member 9 is higher than first component 41, the above-mentioned condition is satisfied.

As described in the present embodiment, conductor wall-like member 9 is preferably a frame-shaped member surrounding the outer periphery of first component 41 when viewed in a direction perpendicular to first main surface 1a. By adopting this configuration, the shield can be reinforced over the entire periphery.

(Modifications)

Figure 5:
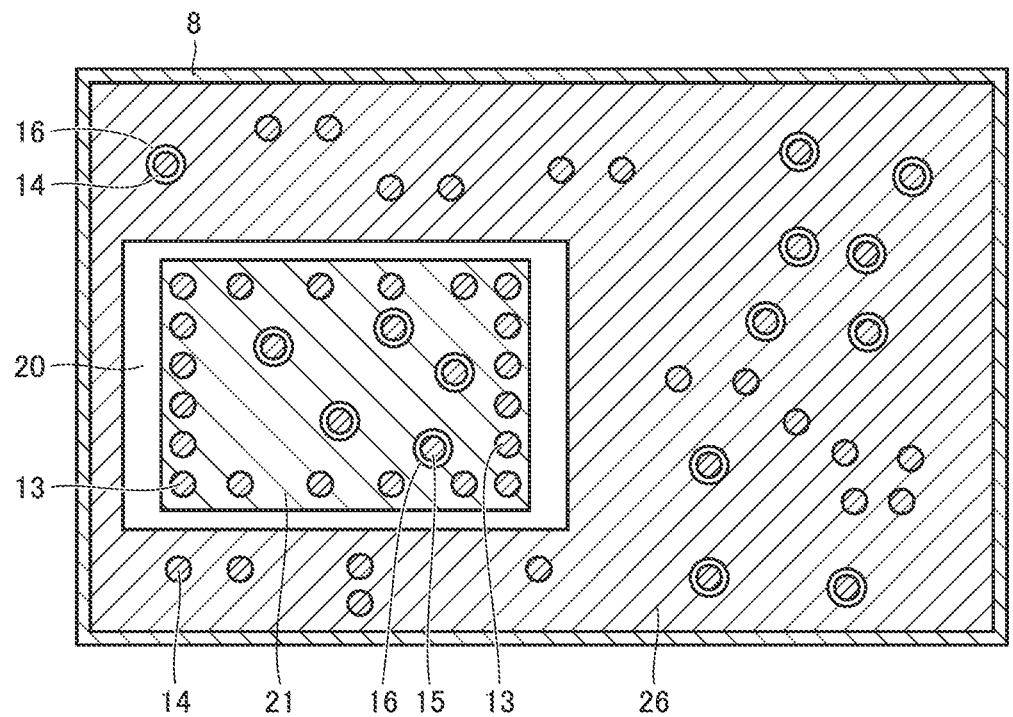
FIG. 5 is a plan view of a layer including a first ground conductor in a modification of the module in the first embodiment according to the present disclosure.

In the example shown in FIG. 4, there is no other conductor at the same height as first ground conductor 21, but one or more other conductors may be disposed at the same height as first ground conductor 21. FIG. 5 shows a modification of the configuration in which another conductor is disposed at the same height. FIG. 5 is a plan view of a layer including first ground conductor 21. In this module, in addition to first ground conductor 21, a ground conductor 26 is also disposed on the same layer inside board 1. First ground conductor 21 and ground conductor 26 are located close to each other with a gap 20 interposed therebetween. In the example shown in FIG. 5, ground conductor 26 surrounds first ground conductor 21. A plurality of conductor vias 13 belonging to first conductor via group 81 are connected to first ground conductor 21. First ground conductor 21 is provided with a number of openings 16, and conductor vias 15 are provided to pass through their respective openings 16. Each conductor via 15 is, for example, a signal line connected to first component 41. As disclosed herein, a signal line is generally connected to first component 41 as a shield target. This signal line preferably passes through the opening of first ground conductor 21. Ground conductor 26 is also provided with a number of openings 16, and conductor vias 14 are provided to pass through their respective openings 16. Through each of openings 16, a signal line of a component other than first component 41 as a shield target preferably passes.

In the present modification, first ground conductor 21 and ground conductor 26 are located close to each other with a gap 20 interposed therebetween. Thus, at the height at which first ground conductor 21 is disposed, any one of the ground conductors is disposed in most of the region. Thereby, the shielding performance can be enhanced.

In the example illustrated in the present embodiment, as shown in FIG. 4, the upper end of conductor wall-like member 9 is not in contact with shield film 8, but the upper end of conductor wall-like member 9 may be in contact with shield film 8.

Second Embodiment

Figure 6:
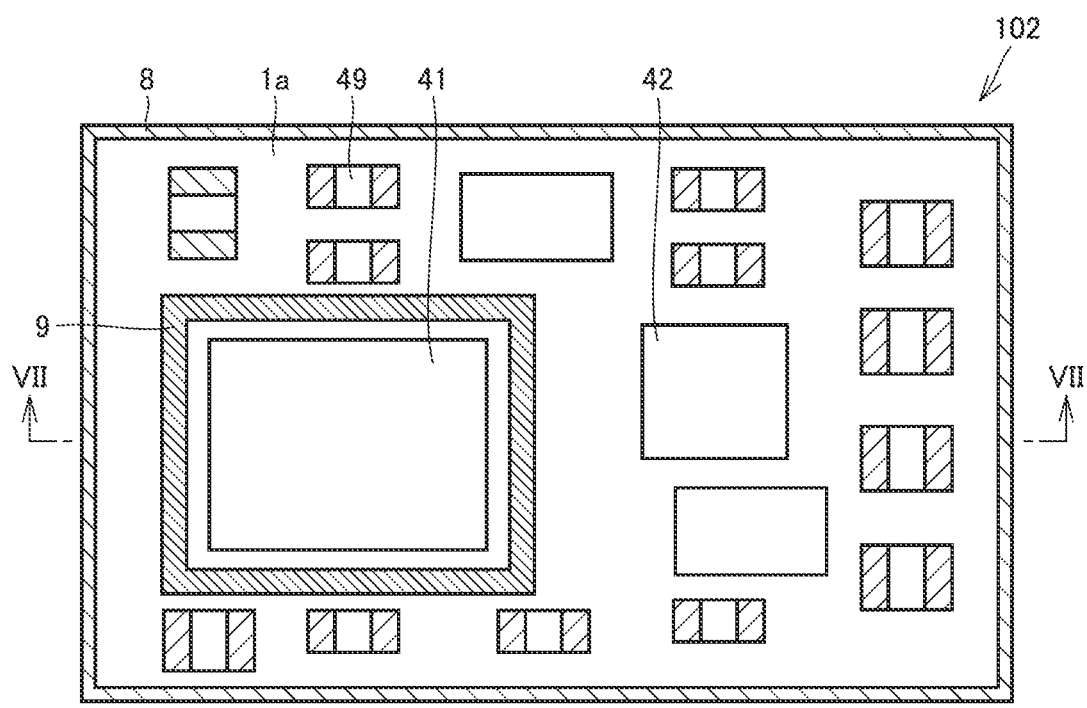
FIG. 6 is a perspective plan view of a module in a second embodiment according to the present disclosure.
Figure 7:
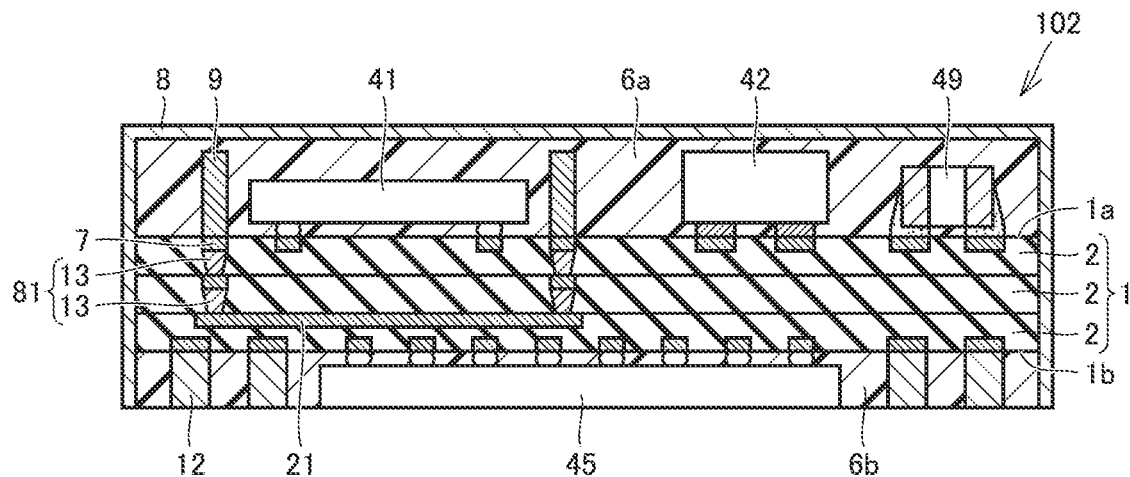
FIG. 7 is a cross-sectional view taken along a line VH-VH in FIG. 6.

A module in the second embodiment according to the present disclosure will be hereinafter described with reference to FIGS. 6 and 7. FIG. 6 is a perspective plan view of a module 102 in the present embodiment. FIG. 6 is a top plan view of module 102 from which the upper surface of a shield film 8 has been removed and a first sealing resin 6a has also been removed. FIG. 7 is a cross-sectional view taken along a line VII-VII in FIG. 6.

Board 1 has a second main surface 1b opposite to a first main surface 1a. In module 102, a second component 45 is mounted on second main surface 1b. Second sealing resin 6b is disposed so as to cover second main surface 1b. The lower surface of second component 45 is exposed from second sealing resin 6b. A conductor column 12 is disposed on second main surface 1b. Conductor column 12 is used as an external electrode of module 102. The lower end of conductor column 12 is exposed from second sealing resin 6b.

In the present embodiment, second main surface 1b of board 1 is also used as a surface on which components are mounted, so that more components can be mounted in a limited area.

Third Embodiment

Figure 8:
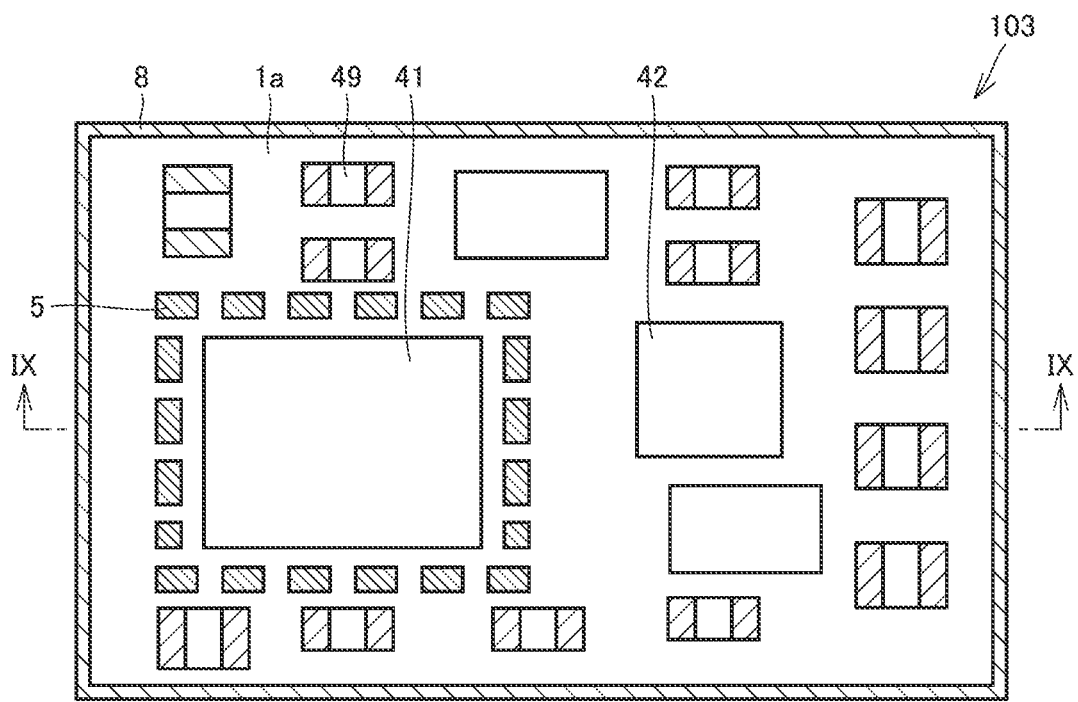
FIG. 8 is a perspective plan view of a module in a third embodiment according to the present disclosure.
Figure 9:
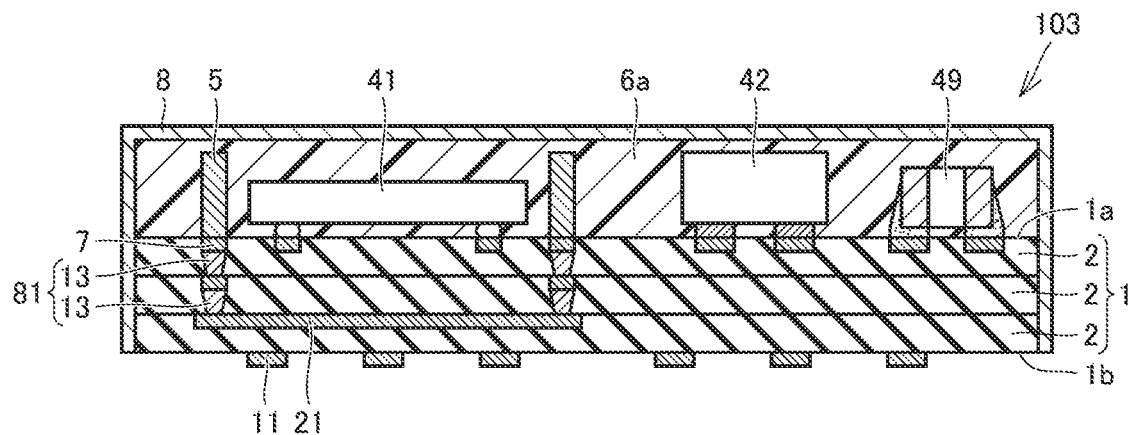
FIG. 9 is a cross-sectional view taken along a line IX-IX in FIG. 8.

A module in the third embodiment according to the present disclosure will be hereinafter described with reference to FIGS. 8 and 9. FIG. 8 is a perspective plan view of a module 103 in the present embodiment. FIG. 9 is a cross-sectional view taken along a line IX-IX in FIG. 8.

Module 103 in the present embodiment includes: a board 1 having a first main surface 1a: a first component 41 mounted on first main surface 1a; a first conductor column group including a plurality of conductor columns 5 arranged on first main surface 1a along at least a part of an outer periphery of first component 41; a first ground conductor 21 disposed inside board 1; a first conductor via group 81 including a plurality of via conductors that connect first ground conductor 21 and an end of each of conductor columns 5 belonging to the first conductor column group, the end of each of conductor columns 5 being located close to first main surface 1a; and a shield film 8 disposed to cover over first component 41. First component 41 is at least partially surrounded by the first conductor column group, first conductor via group 81, and first ground conductor 21. In other words, first component 41 is shielded by the first conductor column group, first conductor via group 81, and first ground conductor 21 that are electrically connected to be contiguous to each other.

First ground conductor 21 is independent of other ground conductors disposed inside board 1. When viewed in a direction perpendicular to first main surface 1a, the first conductor column group surrounds first component 41. In this case, each conductor column 5 belonging to the first conductor column group is not connected to shield film 8. As conductor column 5, a metal pin, a metal block, a protruding electrode, plating, a part of a wire, or the like can be used. First component 41 and the first conductor column group are sealed by a first sealing resin 6a.

In the present embodiment, the module can be reduced in size since the shield can be disposed in the vicinity of the mounted components without damaging the wiring board. In particular, as shown in FIG. 9, conductor column 5, first conductor via group 81, and first ground conductor 21 are electrically connected to be contiguous to each other so as to at least partially surround first component 41. Thereby, the shield for first component 41 as a mounted component can be reinforced as a compartment shield. Further, since each conductor column 5 and shield film 8 are not connected to each other, various noises transmitted through shield film 8 are separated, and thus, noises requiring countermeasures to be taken can be shielded in a focused manner. When each conductor column is not connected to the shield film, the height of each conductor column may preferably be higher than the circuit surface of the mounted component surrounded by each conductor column. Further, the distance between each conductor column and the upper shield film is preferably equal to or less than one-quarter of the wavelength of the frequency to be shielded. The height of each conductor column may preferably be higher than the height of the mounted component.

In the example illustrated in the present embodiment, the upper end of conductor column 5 is not in contact with shield film 8 but may be in contact with shield film 8.

Fourth Embodiment

Figure 10:
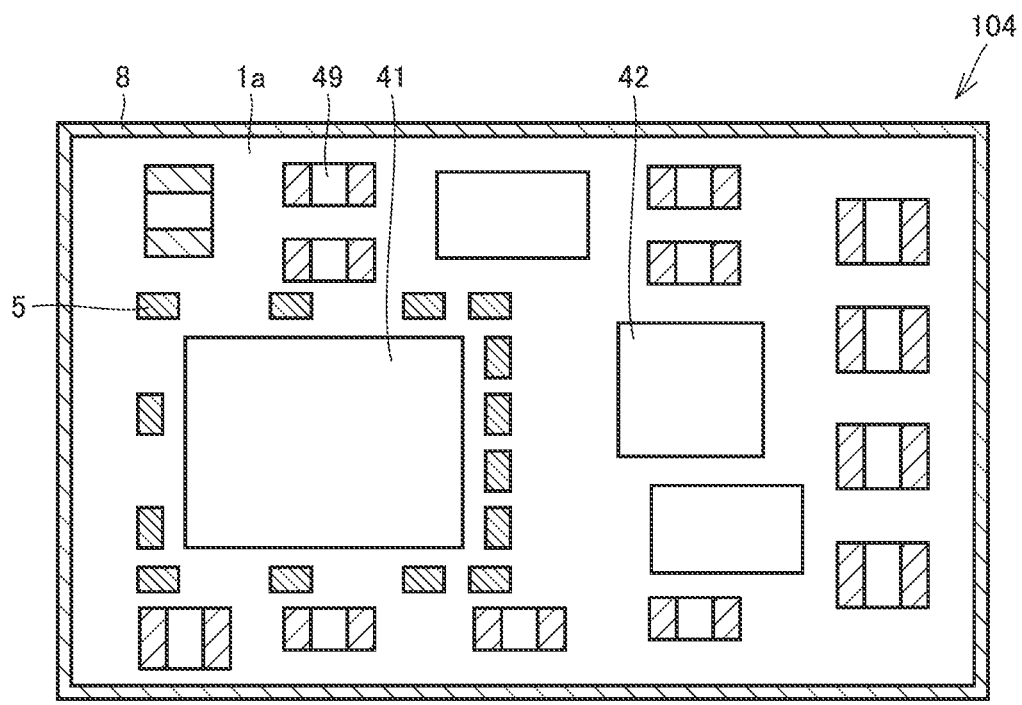
FIG. 10 is a perspective plan view of a module in a fourth embodiment according to the present disclosure.

A module in the fourth embodiment according to the present disclosure will be hereinafter described with reference to FIG. 10. FIG. 10 is a perspective plan view of a module 104 in the present embodiment. In the present embodiment, a plurality of conductor columns 5 belonging to the first conductor column group are not disposed at equal intervals along the entire periphery of first component 41, but are arranged densely along some sections of the periphery of first component 41 and arranged sparsely along other sections of the periphery of first component 41. In the example shown in FIG. 10, a plurality of conductor columns 5 are densely arranged along one of the sides of the periphery of first component 41 that is closer to component 42. Other configurations are the same as those of module 103 described in the third embodiment.

In the present embodiment, the plurality of conductor columns 5 belonging to the first conductor column group are arranged in a non-uniform manner to have a section in which conductor columns 5 are sparsely arranged and a section in which conductor columns 5 are densely arranged. Thus, a desired portion of first component 41 can be shielded in a focused manner.

Fifth Embodiment

Figure 11:
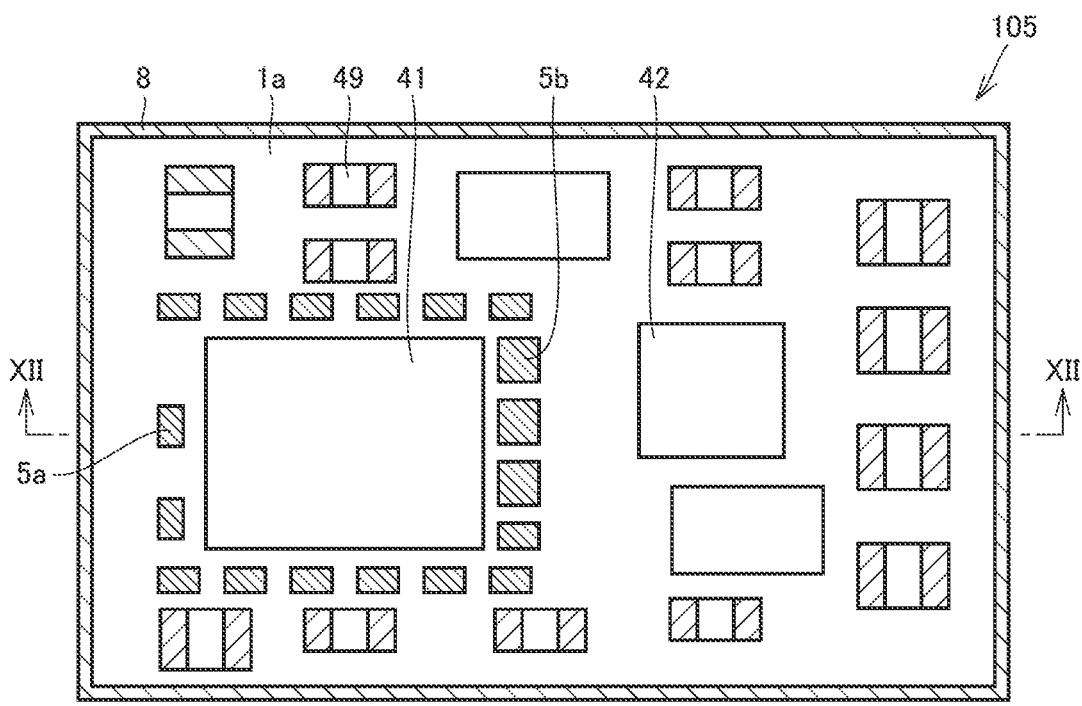
FIG. 11 is a perspective plan view of a module in a fifth embodiment according to the present disclosure.
Figure 12:
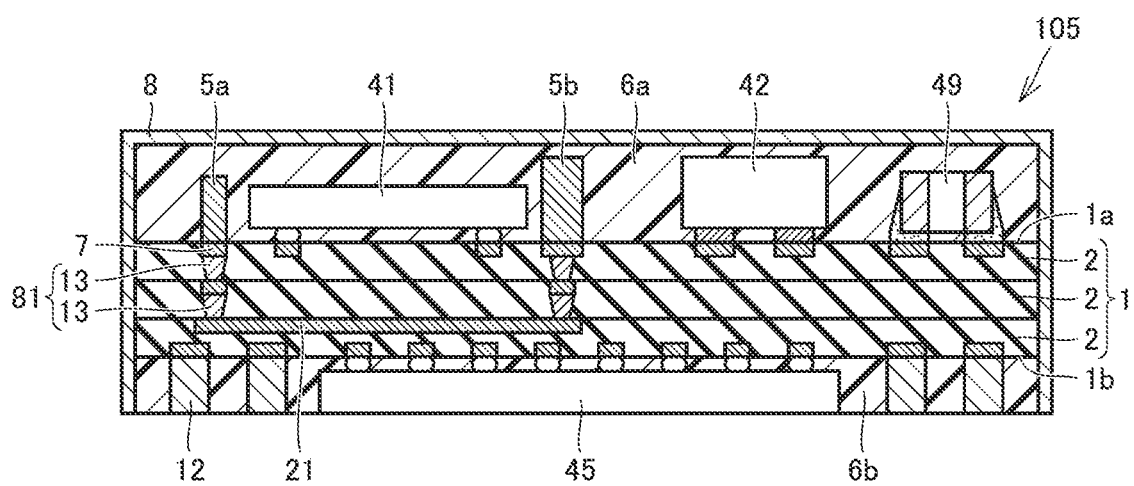
FIG. 12 is a cross-sectional view taken along a line XII-XII in FIG. 11.

A module in the fifth embodiment according to the present disclosure will be hereinafter described with reference to FIGS. 11 and 12. FIG. 11 is a perspective plan view of a module 105 in the present embodiment. FIG. 12 is a cross-sectional view taken along a line XII-XII in FIG. 11.

In the present embodiment, the first conductor column group includes a conductor column 5a and a conductor column 5b. Conductor column 5b is larger in area of a cross section taken in parallel to first main surface 1a than conductor column 5a. In other words, conductor column 5b is thicker than conductor column 5a. Conductor column 5b is higher than conductor column 5a. The conductor columns belonging to the first conductor column group may include only two types of conductor columns 5a and 5b but may include more types of conductor columns. In other words, in the first conductor column group, the conductor columns may vary in thickness and height in multiple stages. Other configurations are the same as those of module 103 described in the third embodiment.

In the present embodiment, the first conductor column group includes conductor columns having different heights. In the present embodiment, the first conductor column group includes conductor columns having different thicknesses.

In the present embodiment, the plurality of conductor columns belonging to the first conductor column group are different in thickness and height. Thus, a desired portion of first component 41 can be shielded in a focused manner.

Figure 13:
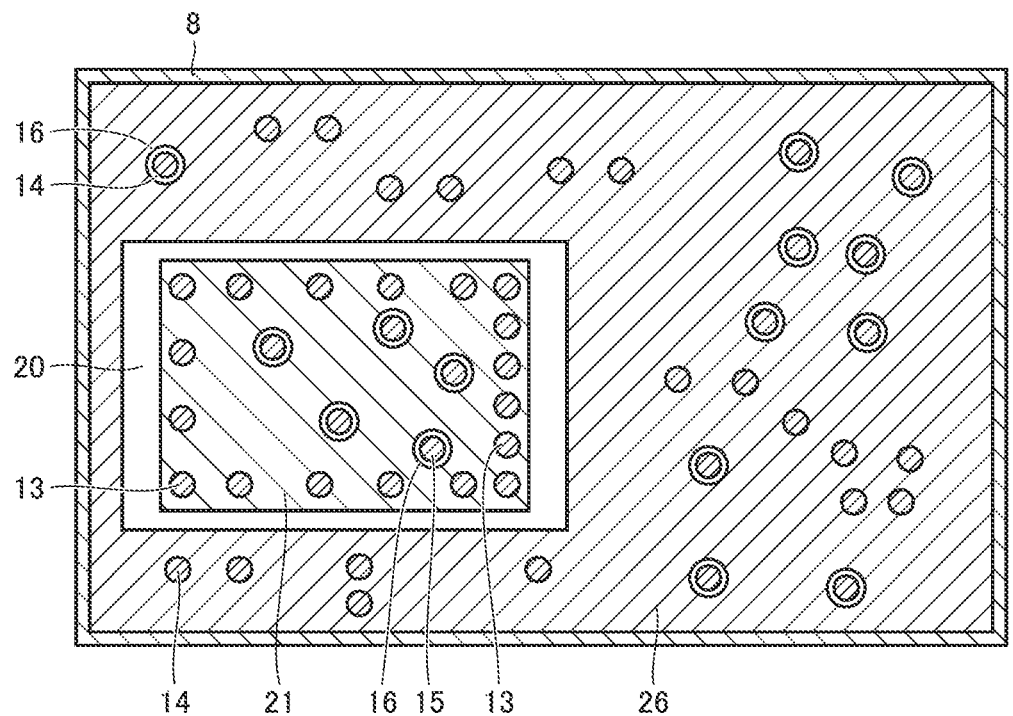
FIG. 13 is a plan view of a layer including a first ground conductor in a modification of the module in the fifth embodiment according to the present disclosure.

In the configuration of the example shown in FIG. 12, there is no other conductor at the same height as first ground conductor 21, but one or more other conductors may be disposed at the same height as first ground conductor 21. FIG. 13 shows a modification of the configuration in which another conductor is disposed at the same height. FIG. 13 is a plan view of a layer including first ground conductor 21. In this module, in addition to first ground conductor 21, a ground conductor 26 is also disposed inside board 1. First ground conductor 21 and ground conductor 26 are located close to each other with a gap 20 interposed therebetween. In the example shown in FIG. 13, ground conductor 26 surrounds first ground conductor 21. A plurality of conductor vias 13 belonging to first conductor via group 81 are connected to first ground conductor 21. Other configurations are the same as those described as the modification of the first embodiment.

As shown in the present embodiment, it is preferable that board 1 has a second main surface 1b opposite to first main surface 1a, and a second component 45 is mounted on second main surface 1b. It is preferable that first ground conductor 21 has an opening, a signal line is connected to first component 41, and the signal line passes through the opening.

Sixth Embodiment

Figure 14:
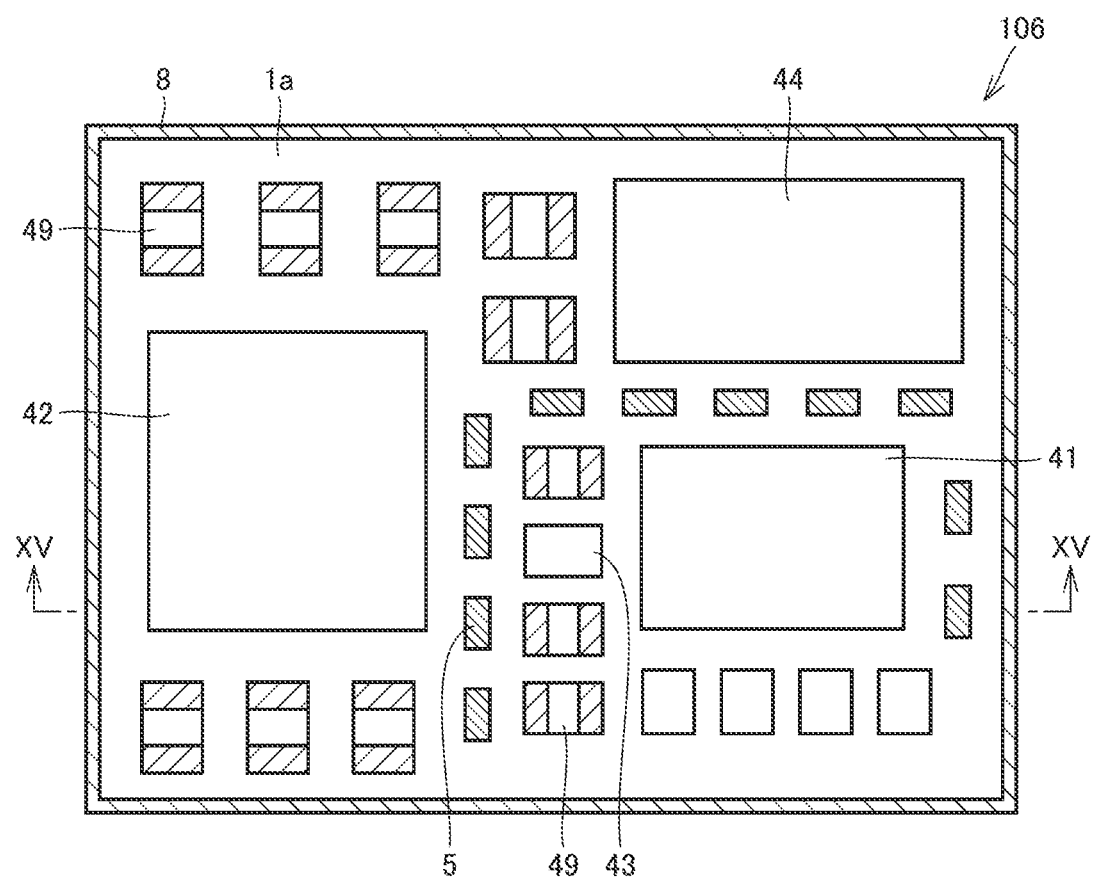
FIG. 14 is a perspective plan view of a module in a sixth embodiment according to the present disclosure.
Figure 15:
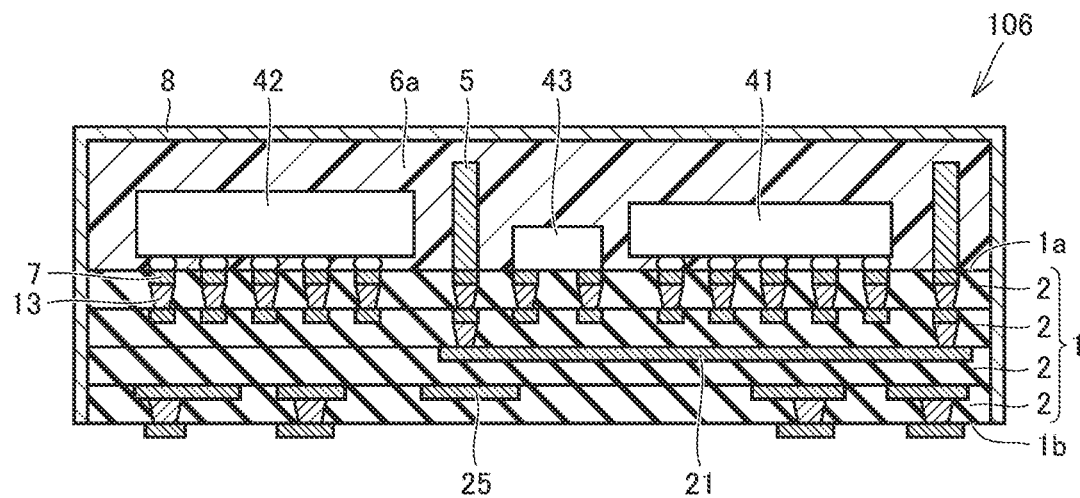
FIG. 15 is a cross-sectional view taken along a line XV-XV in FIG. 14.

A module in the sixth embodiment according to the present disclosure will be hereinafter described with reference to FIGS. 14 and 15. FIG. 14 is a perspective plan view of a module 106 in the present embodiment. FIG. 15 is a cross-sectional view taken along a line XV-XV in FIG. 14.

In the present embodiment, the first conductor column group includes a plurality of conductor columns 5. In a plan view, the first conductor column group surrounds a first component 41, a component 43, and a number of chip components 49 (which will be hereinafter collectively referred to as a "target component group") in a collective manner. Note that the first conductor column group does not completely annularly surround the target component group, but partially surrounds the target component group. In other words, the first conductor column group surrounds the target component group from three sides of left, upper, and right sides in FIG. 14. On the lower side of the target component group in FIG. 14, no first conductor column group is provided but a shield film 8 is provided. In this way, the first conductor column group may not be arranged on the side where shield film 8 is provided.

On the right side in FIG. 14, a plurality of conductor columns 5 are arranged along shield film 8. In this way, a plurality of conductor columns may be further arranged on the side where shield film 8 is provided.

Also in the present embodiment, the same effect as that in the first embodiment can be achieved. As in the present embodiment, the first conductor column group surrounds not only first component 41 but also other components, and thereby, a plurality of components can be collectively shielded. As illustrated in the present embodiment, a desired component can also be shielded by combining the first conductor column group and shield film 8 without requiring complete surrounding only with the first conductor column group.

Seventh Embodiment

Figure 16:
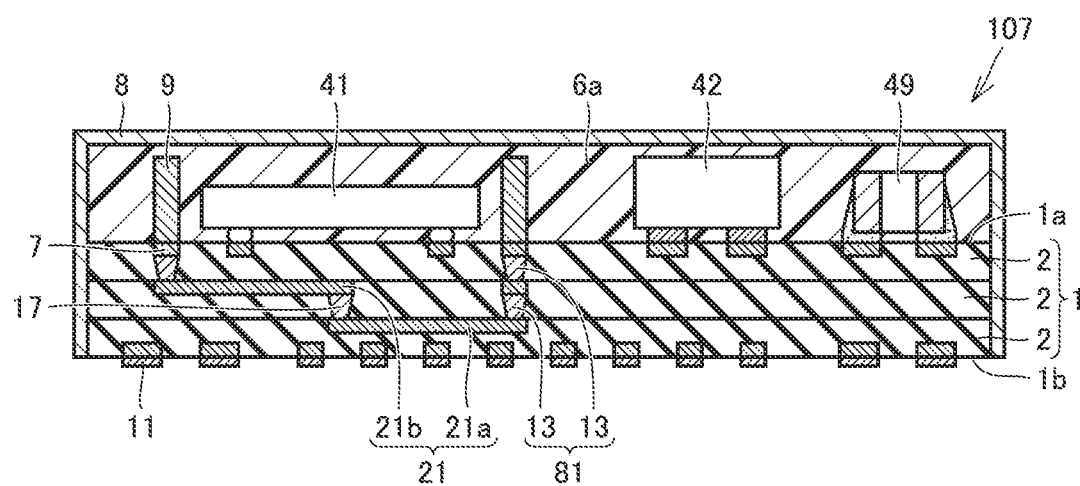
FIG. 16 is a cross-sectional view of a module in a seventh embodiment according to the present disclosure.

A module in the seventh embodiment according to the present disclosure will be hereinafter described with reference to FIG. 16. FIG. 16 is a cross-sectional view of a module 107 in the present embodiment. In module 107, a first ground conductor 21 is formed of a combination of a plurality of conductors. First ground conductor 21 includes a conductor 21a and a conductor 21b. Conductors 21a and 21b are disposed at different heights. Conductors 21a and 21b are electrically connected through a conductor via 17. Other configurations are the same as those of module 101 described in the first embodiment.

Also in the present embodiment, the same effect as that in the first embodiment can be achieved. In the example shown in this case, first ground conductor 21 is configured of a combination of two conductors disposed at different heights, which is however shown merely by way of example. First ground conductor 21 may be a combination of three or more conductors.

In the description of the example in the present embodiment, conductor wall-like member 9 is disposed on first main surface 1a as in the first embodiment, but the first conductor column group including a plurality of conductor columns 5 may be disposed in place of conductor wall-like member 9 on first main surface 1a.

Eighth Embodiment

Figure 17:
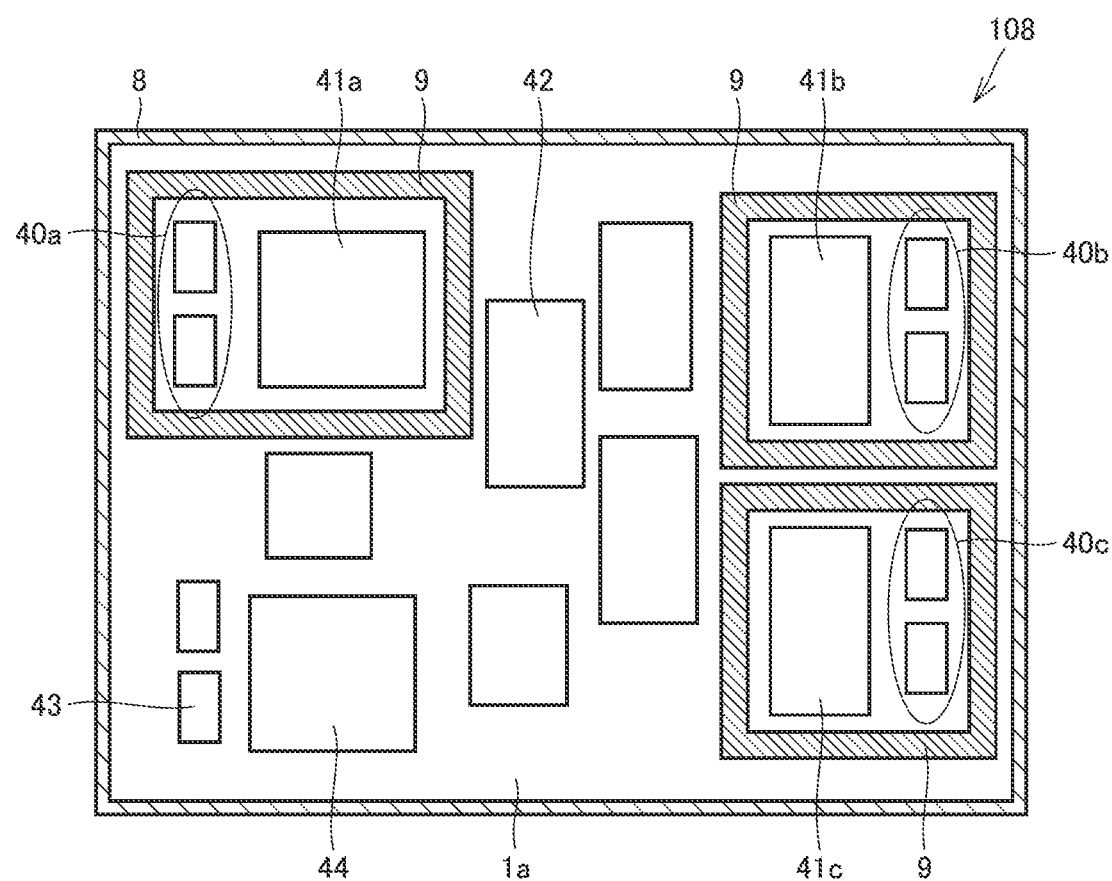
FIG. 17 is a perspective plan view of a module in an eighth embodiment according to the present disclosure.

A module in the eighth embodiment according to the present disclosure will be hereinafter described with reference to FIG. 17. In a module 108, components 41a, 41b, and 41c each as the first component are mounted on a first main surface 1a. Component 41a is a power amplifier (PA). Component 41b is a low noise amplifier (LNA). Component 41c is an antenna switch (ANT SW). In addition to these components, a number of electronic components are mounted on first main surface 1a. For example, components 42, 43, and 44 are mounted on first main surface 1a. A matching circuit 40a for a power amplifier is mounted in the vicinity of component 41a as a power amplifier. A matching circuit 40b for a low noise amplifier is mounted in the vicinity of component 41b as a low noise amplifier. A matching circuit 40c for an antenna switch is mounted in the vicinity of component 41c as an antenna switch. In this case, each of the matching circuits is shown as two small rectangular components by way of example, but the size, the shape, and the number of components as a matching circuit are not limited thereto.

A power amplifier and the like each are mounted as a transmission device while a low noise amplifier and the like each are mounted as a reception device. An antenna switch and the like each are mounted as a common device.

Module 108 includes a conductor wall-like member 9 disposed to surround each of components 41a, 41b, and 41c as first components. In a plan view of module 108, conductor wall-like member 9 is arranged in a frame shape. In surrounding component 41a as the first component, conductor wall-like member 9 is disposed to collectively surround not only component 41a but also matching circuit 40a mounted in the vicinity of component 41a. In surrounding component 41b as the first component, conductor wall-like member 9 is disposed to collectively surround not only component 41b but also matching circuit 40b mounted in the vicinity of component 41b. In surrounding component 41c as the first component, conductor wall-like member 9 is disposed to collectively surround not only component 41c but also matching circuit 40c mounted in the vicinity of component 41c.

The isolation between devices deteriorates particularly due to magnetic flux coupling that is caused by an inductor as a matching circuit. Therefore, it is effective to surround the matching circuit with a shield in order to prevent deterioration of isolation. In the present embodiment, the devices and the matching circuits associated with the respective devices are collectively surrounded by a shield formed of conductor wall-like member 9, so that deterioration of isolation can be prevented.

In the example shown in this case, the transmission device, the reception device, and the common device are divided into three groups that are surrounded for each group by respective shields each including conductor wall-like member 9, but only some of these three groups of the transmission device, the reception device, and the common device may be surrounded by their respective shields each including conductor wall-like member 9.

Figure 18:
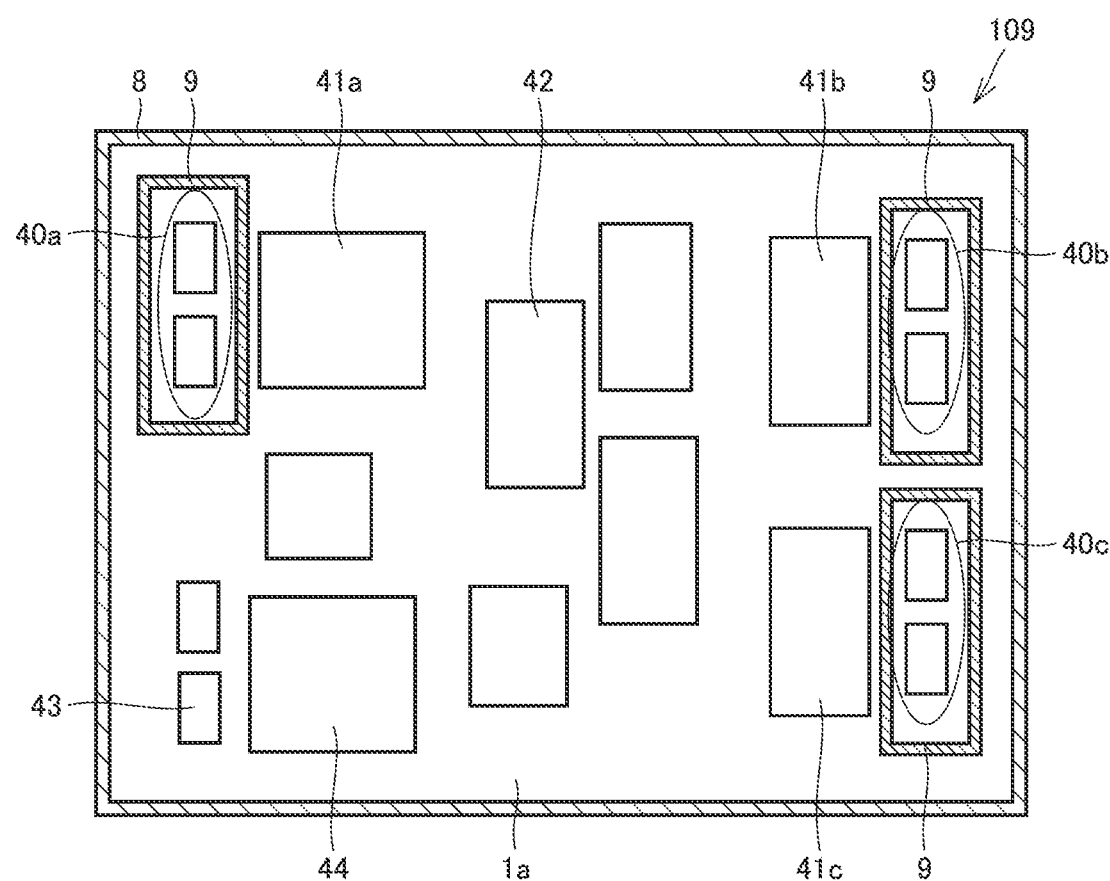
FIG. 18 is a perspective plan view of a modification of the module in the eighth embodiment according to the present disclosure.

FIG. 18 shows a modification of the module in the present embodiment. In a module 109 shown in FIG. 18, conductor wall-like member 9 does not surround each of components 41a, 41b, and 41c, but surrounds only each of matching circuits 40a, 40b, and 40c. In other words, only matching circuits 40a, 40b, and 40c are surrounded by their respective shields. From the viewpoint of suppressing magnetic flux coupling caused by matching circuits, it is also meaningful to shield only each of matching circuits 40a, 40b, and 40c in this way. In the case of the present modification, the same feature as described above is applicable if matching circuits 40a, 40b, and 40c are regarded as the first components in place of components 41a, 41b, and 41c.

Among the above-described embodiments, one or more of the embodiments may be employed in an appropriate combination.

The above embodiments disclosed herein are illustrative and non-restrictive in every respect. The scope of the present disclosure is defined by the terms of the claims, and is intended to include any modifications within the meaning and scope equivalent to the terms of the claims.

1 board, 1a first main surface, 1b second main surface, 2 insulating layer, 5 conductor column, 6a first sealing resin, 6b second sealing resin, 8 shield film, 9 conductor wall-like member, 13, 14, 15 conductor via, 20 gap, 21 first ground conductor, 21a, 21b conductor, 40a, 40b, 40c matching circuit, 41, 41a, 41b, 41c first component, 43 component, 45 second component, 49 chip component, 81 first conductor via group, 101, 102, 103, 104, 105, 106, 107, 108, 109 module.

The invention claimed is:
1. A module comprising:
a board having a first main surface;
a first component mounted on the first main surface;
a first conductor column group including a plurality of conductor columns arranged on the first main surface along at least a part of an outer periphery of the first component;
a first ground conductor disposed inside the board;
a first conductor via group including a plurality of via conductors connecting the first ground conductor and an end of each of the conductor columns belonging to the first conductor column group, the end of each of the conductor columns being located close to the first main surface; and
a shield film disposed to cover over the first component, wherein
when viewed in a cross section taken along a plane perpendicular to the first main surface, the first component is at least partially surrounded by the first conductor column group, the first conductor via group, and the first ground conductor.

2. The module according to claim 1, further comprising one or more other ground conductors disposed inside the board, wherein the first ground conductor is independent of the one or more other ground conductors.

3. The module according to claim 2, wherein the first conductor column group surrounds the first component when viewed in a direction perpendicular to the first main surface.

4. The module according to claim 2, wherein the board has a second main surface opposite to the first main surface, and a second component is mounted on the second main surface.

5. The module according to claim 2, wherein the first conductor column group includes conductor columns having different heights.

6. The module according to claim 1, wherein the first conductor column group surrounds the first component when viewed in a direction perpendicular to the first main surface.

7. The module according to claim 6, wherein the board has a second main surface opposite to the first main surface, and a second component is mounted on the second main surface.

8. The module according to claim 6, wherein the first conductor column group includes conductor columns having different heights.

9. The module according to claim 1, wherein the board has a second main surface opposite to the first main surface, and the module further comprises a second component mounted on the second main surface.

10. The module according to claim 1, wherein the first conductor column group includes conductor columns having different heights.

11. The module according to claim 1, wherein the first conductor column group includes conductor columns having different thicknesses.

12. The module according to claim 1, wherein the conductor columns belonging to the first conductor column group are not in contact with the shield film.

13. The module according to claim 12, wherein the board has a second main surface opposite to the first main surface, and a second component is mounted on the second main surface.

14. The module according to claim 1, wherein the first component and the first conductor column group are sealed by a first sealing resin.

15. The module according to claim 1, wherein the first ground conductor has an opening, a signal line is connected to the first component, and the signal line passes through the opening.

16. A module comprising:

a board having a first main surface;

a first component mounted on the first main surface;

a conductor wall-like member disposed on the first main surface along at least a part of an outer periphery of the first component;

a first ground conductor disposed inside the board;

a first conductor via group including a plurality of via conductors connecting the first ground conductor and an end of the conductor wall-like member, the end of the conductor wall-like member being located close to the first main surface; and a shield film disposed to cover over the first component, wherein when viewed in a cross section taken along a plane perpendicular to the first main surface, the first component is at least partially surrounded by the conductor wall-like member, the first conductor via group, and the first ground conductor.

17. The module according to claim 16, wherein, when viewed in a direction perpendicular to the first main surface, the conductor wall-like member is a frame-shaped member surrounding the outer periphery of the first component.

18. The module according to claim 16, wherein the conductor wall-like member is not in contact with the shield film.

19. The module according to claim 16, wherein the first component and the conductor wall-like member are sealed by a first sealing resin.

20. The module according to claim 16, wherein the first ground conductor has an opening, a signal line is connected to the first component, and the signal line passes through the opening.

* * * * *